United States Patent [19]
Drekmeier

[11] Patent Number: 5,808,868
[45] Date of Patent: Sep. 15, 1998

[54] ELECTRONIC MODULE WITH POWER COMPONENTS

[75] Inventor: Karl-Gerd Drekmeier, Unterhaching, Germany

[73] Assignee: Siemens Aktiengesellschaft, Munich, Germany

[21] Appl. No.: 708,976

[22] Filed: Sep. 6, 1996

[30] Foreign Application Priority Data

Sep. 8, 1995 [DE] Germany .................. 195 33 298.9

[51] Int. Cl.[6] ................................................. H05K 7/20
[52] U.S. Cl. .................... 361/704; 361/688; 361/709; 361/710; 361/715; 361/728; 361/736; 361/752; 165/80.2; 165/80.3; 257/706; 257/717; 257/718; 257/719
[58] Field of Search ................................ 361/704, 707, 361/709, 710, 711, 715, 716, 717, 736, 752; 165/80.3, 185; 257/687, 706, 718, 719

[56] References Cited

U.S. PATENT DOCUMENTS 4,230,901 10/1980 Wengler et al. ..................... 361/717
5,109,317 4/1992 Miyamoto et al. .................. 361/715
5,126,829 6/1992 Daikoku et al. ..................... 257/713
5,296,739 3/1994 Heilbronner et al. ................ 257/687

*Primary Examiner*—Leo P. Picard
*Assistant Examiner*—Boris L. Chervinsky
*Attorney, Agent, or Firm*—Hill, Steadman & Simpson

[57] ABSTRACT

The protective housing (11) of the module IS placed in the manner of a cap on the outer edge (3) of a cooling body (1), on whose heat contact surface (5) facing the protective housing (11) lie the power components (9) or the circuit bearer (6) of a hybrid circuit (8). The protective housing (11) is made of plastic and has integrated clamp and lock areas (12, 13). The outer edge (3) of the cooling body (1) is fashioned so that by placing on of the protective housing (11) an annular positive and frictional connection can be produced between the protective housing (11) and the cooling body (1). The placing on simultaneously effects the surface pressure between the power components (9) and a heat contact surface (5) of the cooling body (1) by means of frictional connection elements (16, 17, 21) arranged between the power components (9) and the protective housing (11). Using this modular construction, the production of the thermal coupling to the cooling body (1), which would otherwise be additionally required, can be integrated into the cooling body/protective housing assembly procedure.

5 Claims, 2 Drawing Sheets

ELECTRONIC MODULE WITH POWER COMPONENTS

BACKGROUND OF THE INVENTION

The present invention relates to an electronic module having power components, a cooling body, a protective housing with outer terminals, and a device for effecting surface pressure between the power components and a heat contact surface of the cooling body.

Modules of this type with power components or power hybrids are already on the market.

In modules with high power loss (high heat generation), a cooling body or cooling plate must be provided in order to conduct away the thermal power that is lost by the modules. Previously, the individual power components or the circuit bearer of a hybrid circuit have been attached to the cooling body with individual fastening elements in separate assembly procedures. The individual fastening of power semiconductors usually takes place by means of screwing or riveting, or, in hybrid circuits, coating the entire surface of a heat contact surface of the cooling body with heat-conducting glue. Since with respect to good heat transmission a thin layer of glue is desirable, a specific pressure apparatus is required. The hybrid circuit must thus be additionally pressed on the cooling body during the production of the thermal coupling to the cooling body. A further separate assembly procedure has previously been required in order to connect the protective housing with the cooling body, the hybrid circuit already being attached to the cooling body. Previously, in the modules, which are used for example as a regulating module for climate control equipment in motor vehicles, a simple plastic cap provided with openings for the outer terminals of the module has been placed loosely on the cooling body.

SUMMARY OF THE INVENTION

It is an object of the present invention to provide a modular construction for the above-described modules that is easier to assemble.

According to the present invention, this is achieved in a module of the above-described type and having the following novel elements. The protective housing can be placed in the manner of a cap on the outer edge of the cooling body, on whose heat contact surface facing the protective housing lie the power components. The protective housing is made of plastic and has integrated clamp and lock areas. The outer edge of the cooling body is fashioned so that when the protective housing is placed thereon, an annular positive and frictional connection can be produced between the protective housing and the cooling body. The surface pressure is effected at the same time as the placing on of the protective housing, by means of frictional connection elements arranged between the power components and the protective housing.

Advantageous developments of the present invention are as follows.

In place of the power components on the circuit bearer a power hybrid circuit is pressed in a planar fashion on the heat contact surface.

The protective housing is fashioned with integrated frictional connection elements made of elasticized plastic. By means of reversible deformation of the connection elements the surface pressure is effected.

Above the power components there are arranged elastic pressure elements having such a high residual resetting force that, working together with plungers integrated into the protective housing, a surface pressure results with a heat transmission that is sufficient for the cooling.

The inventive construction technique for the module essentially enables a continuous assembly sequence, in order for example to fasten a thermally highly stressed hybrid circuit and a terminal-reinforced protective housing on the cooling body. The inventive assembly procedures are based on frictional and positive connections with discrete fastening elements, without intermediate fastening or pressing procedures. The positive connection is thereby essentially ensured by means of the clamp and lock areas on the protective housing, which, formed as cavities, receive and grip from behind corresponding projections fashioned on the outer edge of the cooling body, or, respectively, provide for the locking thereof. These elements work together to form a positive connection enables the transmission of force and thereby also the frictional and sealing joining of the upper part (protective housing) and the lower part (cooling body) of the module. The clamp and lock area of the protective housing must thereby be able to conform tightly in an elastic manner to the outer edge of the cooling body, which is ensured by the annular positive and frictional connection. Additionally, this area must be flexible enough for motions in the plane transverse to the direction of placement. After the locking of the projections of the cooling body in the cavities of the protective housing, a vertical motion of the upper and lower part of the module against one another is no longer possible. With the placement of the protective housing on the outer edge of the cooling body, the surface pressure between the power components, or a circuit bearer, and a heat contact surface of the cooling body is simultaneously effected by means of an additional vertical frictional connection. In addition, frictional connection elements are vertically arranged between the power components and a thereto parallel inner wall of the protective housing, with a residual resetting force that is so high that, after the placement and locking of the two module parts, a surface pressure results having a sufficiently good heat transmission for the cooling. The production of the thermal coupling is thus integrated into the cooling body/protective housing assembly procedure.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
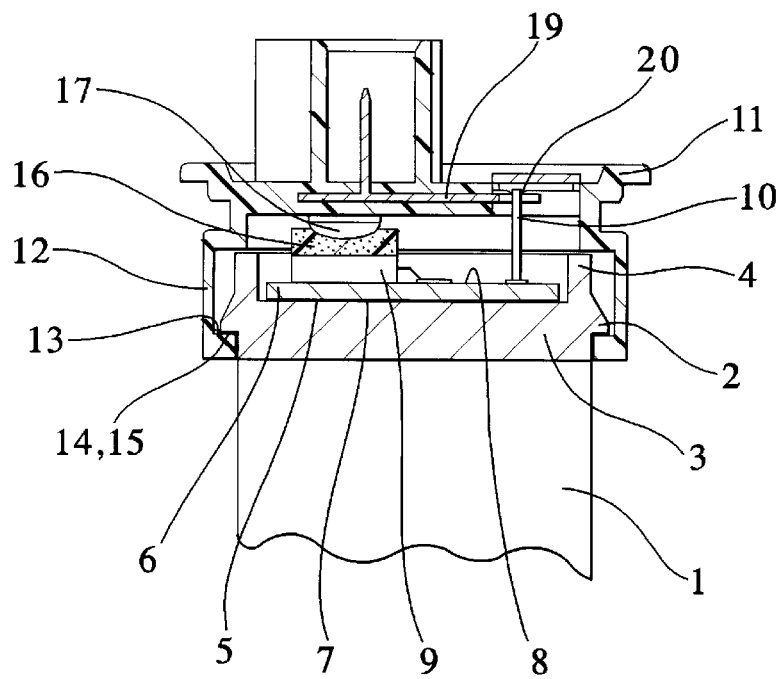
FIGS. 1 and 2 are a first exemplary embodiment of a module according to the present invention, in a lateral and longitudinal sectional views respectively.
Figure 2:
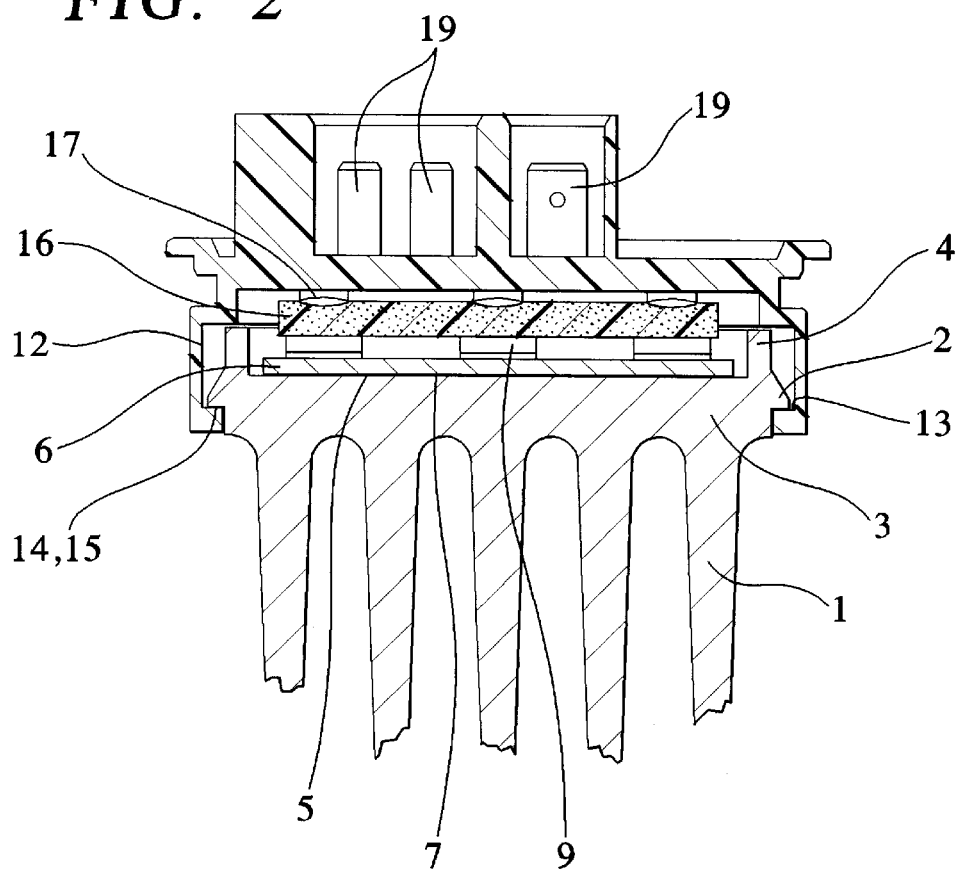

The bearer element of the module is the cooling body 1 (see FIG. 1). The integrally formed projections 2 are arranged in subareas around the outer edge 3 of the cooling body 1. The circumferential edge 4 additionally lends the cooling body 1 a sufficiently large mechanical moment of resistance, in order to hold the heat contact surface 5 flat on the circuit bearer 6 for a good thermal coupling, or to hold it flat directly on a power component 9. The advantage of this construction can be clearly seen as soon as it is noted that the cooling body 1 is subject to relatively large forces. In so far as the heat contact surface 5 is not already very flat, it is possible to provide a layer of glue or heat conducting paste as a compensating medium 7. A ductile metal foil is also possible. Even if the mentioned adhesive layer is provided, the advantage still ensues (which reduces the assembly expense considerably) that the circuit bearer 6 does not have to be additionally held down in order to produce the desired thin film. Rather, this effect is already achieved by means of the surface pressure resulting from the placement and locking on of the module parts. In the first and second exemplary embodiments (FIGS. 1 and 2), the hybrid circuit 8 is hybridized to a finished state before the assembly of the module with the power components 9 and terminals 10.

FIG. 1 shows a protective housing made of thermal and mechanical high-stress plastic, for example, PBT (polybutylenterephthalate), which has integrated clamp and lock areas 12 and 13, which produce a frictional and positive connection 14 and 15 between the protective housing and the cooling body 1. The pressure element 16, which is made for example of elasticized plastic and is laid on in a loose fashion before the placing of the protective housing on the power components, has a residual resetting force in the temperature region from −40° to 150° C. that effects a permanent surface pressure between the heat contact surface 5 and the circuit bearer 6, with a force of about 10–15 N/cm$^2$. The requirement of a high resetting force that remains constant over a relatively large time and temperature range means that for example about 80% of the depth of penetration of the power component 9 into the pressure element 16 is available not as residual but rather as reversible deformation, that is, as a resetting force that is effective for the surface pressure. A sufficiently good heat transmission is thereby ensured. The plungers 17, visible in FIG. 1 and FIG. 2, which are arranged on an inner side of the protective housing 11 parallel to the power component, are dimensioned so that the necessary surface pressure arises but the elastic limits of deformation of the pressure element 16 are not exceeded. Upon the joining of the protective housing 11 and the cooling body 1, the hybrid terminals 10 are positioned with the outer terminals 19 of the module such that the solder connections 20 are subsequently collectively producible.

Figure 3:
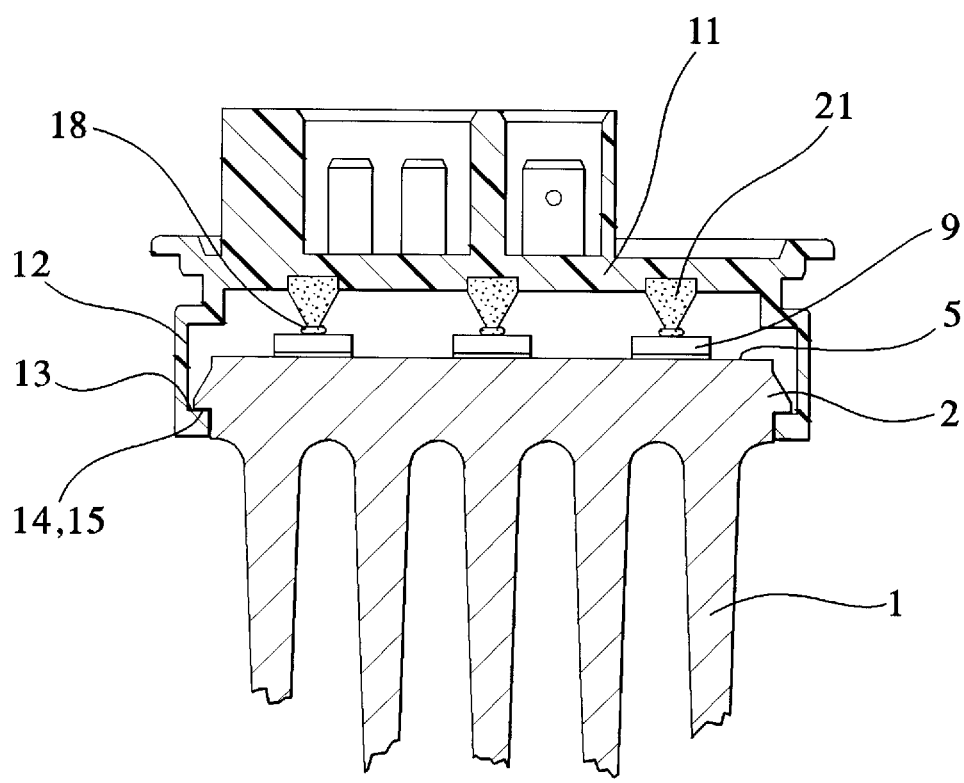
FIG. 3 shows a further exemplary embodiment, in lateral sectional view.

FIG. 3 shows, as a further possibility, a modular construction having integrated frictional connection elements 21 made of elastomer-modified thermoplast. These frictional connection elements 21 are connected with the protective housing 11 through injection. The provided surface pressure between a circuit bearer 6 or, as shown, individual power semiconductors (components 9) and the heat contact surface 5 of the cooling body 1 is achieved by means of the reversible deformation 18 of the frictional connection elements 21. The positive and frictional connections between the protective housing 11 and the cooling body 1 ensue in a manner analogous to that shown and described for the first two exemplary embodiments.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An electronic module having power components, a cooling body, a protective housing with outer terminals, and a surface pressure being effected between the power components and a heat contact surface of the cooling body, comprising:

the protective housing positioned like a cap on an outer edge of the cooling body, the cooling body having a heat contact surface which faces the protective housing and on which lie the power components;

the protective housing formed from a plastic material and having integrated clamp and lock areas;

the outer edge of the cooling body structured so that when the protective housing is placed on the outer edge of the cooling body, an annular positive and frictional connection is produced between the protective housing and the cooling body; and the surface pressure being effected at the same time as the placing of the protective housing on the outer edge of the cooling body, by frictional connection elements arranged between the power components and the protective housing.

2. The electronic module according to claim 1, wherein the integrated frictional connection elements are made of elasticized plastic.

3. An electronic module having power components, comprising:

a cooling body having a heat contact surface on which are located the power components;

a protective housing in the form of a cap that is positioned on an outer edge of the cooling body and over the heat contact surface;

the protective housing being formed of a plastic material and having integrated clamp and lock areas;

the outer edge of the cooling body being structured so that when the protective housing is positioned on the outer edge, an annular positive and frictional connection is produced between the protective housing and the cooling body;

a surface pressure being effected that presses the power components against the heat control surface by elastic pressure element arranged between the power components and the protective housing.

4. The electronic module according to claim 3, which the integrated frictional connection elements are made of elasticized plastic.

5. The electronic module according to claim 3, wherein the protective housing has integrated plungers and wherein elastic pressure elements are arranged above the power components, the elastic pressure elements having such a high residual resetting force that, working together with plungers integrated into the protective housing, a surface pressure results with a heat transmission that cools the power components.

* * * * *